(12) United States Patent
Kim et al.

(10) Patent No.: US 11,531,618 B2
(45) Date of Patent: Dec. 20, 2022

(54) MEMORY MODULES AND METHODS OF OPERATING SAME

(71) Applicant: Samsung Electronics Co., Ltd., Suwon-si (KR)

(72) Inventors: Kyungsoo Kim, Seoul (KR); Jinin So, Hwaseong-si (KR); Jong-Geon Lee, Seoul (KR); Yongsuk Kwon, Goyang-si (KR); Jin Jung, Seoul (KR); Jeonghyeon Cho, Hwaseong-si (KR)

(73) Assignee: Samsung Electronics Co., Ltd.

( * ) Notice: Subject to any disclaimer, the term of this patent is extended or adjusted under 35 U.S.C. 154(b) by 65 days.

(21) Appl. No.: 17/157,323

(22) Filed: Jan. 25, 2021

(65) Prior Publication Data
US 2021/0390049 A1    Dec. 16, 2021

(30) Foreign Application Priority Data

Jun. 11, 2020 (KR) .................. 10-2020-0070658

(51) Int. Cl.
*G06F 12/0804*    (2016.01)
*G06F 11/20*    (2006.01)
(Continued)

(52) U.S. Cl.
CPC ...... *G06F 12/0804* (2013.01); *G06F 11/2094* (2013.01); *G11C 11/4093* (2013.01);
(Continued)

(58) Field of Classification Search
CPC ............ G06F 12/0804; G06F 11/2094; G06F 2201/82; G06F 2212/1032; G06F 2212/1016; G06F 2212/7203; G06F 2212/7204; G06F 12/0284; G06F 12/0292; G06F 12/0877; G06F 13/1673; G06F 13/1689; G06F 13/4243; G11C 11/4093; G11C 11/4096; G11C 29/52; G11C 29/886; G11C 7/1006; G11C 7/1063; G11C 11/4076; G11C 7/1045; G11C 29/08; G11C 29/4401; G11C 5/04; H04N 21/42692; G06N 3/0454; G06N 3/08
(Continued)

(56) References Cited

U.S. PATENT DOCUMENTS 8,234,460 B2   7/2012   Walker
8,432,735 B2   4/2013   Kim et al.
(Continued)

FOREIGN PATENT DOCUMENTS

KR    101824227 B1    2/2018

*Primary Examiner* — Fernando Hidalgo
(74) *Attorney, Agent, or Firm* — Myers Bigel, P.A.

(57) ABSTRACT

A memory module includes a first memory device, a second memory device, and a processing buffer circuit that is connected to the first memory device and the second memory device (independently of each other) and a host. A processing buffer circuit is provided, which includes a processing circuit and a buffer. The processing circuit processes at least one of data received from the host, data stored in the first memory device, or data stored in the second memory device based on a processing command received from the host. The buffer is configured to store data processed by the processing circuit. The processing buffer circuit is configured to communicate with the host in compliance with a DDR SDRAM standard.

19 Claims, 13 Drawing Sheets

(51) Int. Cl.
  *G11C 11/4093* (2006.01)
  *G11C 11/4096* (2006.01)
  *H04N 21/426* (2011.01)

(52) U.S. Cl.
  CPC ... *G11C 11/4096* (2013.01); *H04N 21/42692* (2013.01); *G06F 2201/82* (2013.01); *G06F 2212/1032* (2013.01)

(58) Field of Classification Search
  USPC ........................................................ 711/105
  See application file for complete search history.

(56) References Cited

U.S. PATENT DOCUMENTS

| | | | |
|---|---|---|---|
| 8,751,693 B2 * | 6/2014 | Sugimura | G06F 15/8015 710/5 |
| 9,535,876 B2 | 1/2017 | Walker | |
| 9,886,340 B2 | 2/2018 | Ahn et al. | |
| 10,083,722 B2 | 9/2018 | Oh et al. | |
| 10,416,896 B2 | 9/2019 | O et al. | |
| 10,503,641 B2 | 12/2019 | Boyer et al. | |
| 2013/0028037 A1 * | 1/2013 | Fujisawa | G11C 11/4074 365/222 |
| 2017/0344301 A1 | 11/2017 | Ryu et al. | |
| 2019/0073261 A1 * | 3/2019 | Halbert | H03M 13/095 |
| 2020/0226070 A1 * | 7/2020 | Byun | G06F 12/1009 |
| 2021/0279185 A1 * | 9/2021 | Lim | G06F 12/084 |
| 2021/0313005 A1 * | 10/2021 | Shan | G11C 29/4401 |

* cited by examiner

FIG. 8A

|     |     |     |     |
|-----|-----|-----|-----|
| D11 | D12 | D13 | D14 |
| D21 | D22 | D23 | D24 |
| D31 | D32 | D33 | D34 |
| D41 | D42 | D43 | D44 |

|     |     |     |     |
|-----|-----|-----|-----|
| D11 | D21 | D31 | D41 |
| D12 | D22 | D32 | D42 |
| D13 | D23 | D33 | D43 |
| D14 | D24 | D34 | D44 |

123a

...

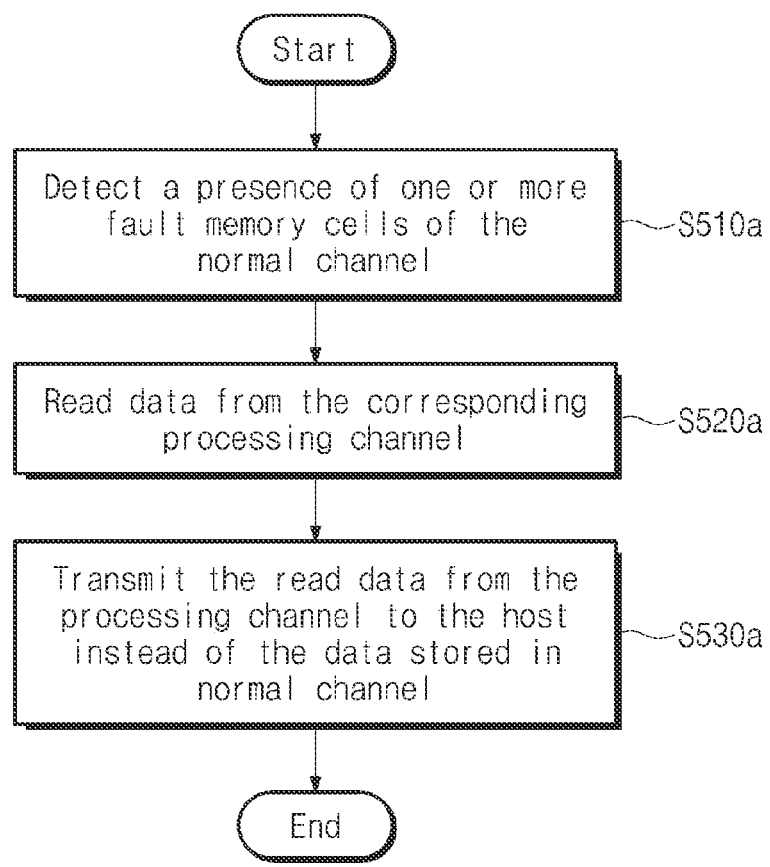

MEMORY MODULES AND METHODS OF OPERATING SAME

REFERENCE TO PRIORITY APPLICATION

This application claims priority under 35 U.S.C. § 119 to Korean Patent Application No. 10-2020-0070658, filed Jun. 11, 2020, the disclosure of which is hereby incorporated herein by reference.

BACKGROUND

Embodiments of the inventive concept described herein relate to memory modules and methods of operating same, and, more particularly, to memory modules capable of performing an offloaded operation through a standard memory interface and methods of operating same.

A memory device may store data input from an external host. Also, the memory device may output data stored therein in response to a request from the external host. A substrate on which one or more memory devices and one or more parts associated with the memory devices are mounted may be referred to as a "memory module". A memory module including a processor capable of processing data may perform an operation on data stored in the memory module, based on a command received from the host. In other words, the memory module may have a near data processing (NDP) structure.

SUMMARY

Embodiments of the inventive concept provide a memory module, which includes a processor that supports an offloaded operation(s) using a standard DDR memory interface, and which is capable of accessing data in the memory module without intervention of a host, and methods of operating same.

According to an exemplary embodiment, a memory module may include a first memory device, a second memory device, and a processing buffer circuit. This processing buffer circuit is connected to the first memory device and the second memory device (independently of each other) and is connected to a host. The processing buffer circuit may include a processing circuit that processes at least one of data received from the host, data stored in the first memory device, or data stored in the second memory device based on a processing command received from the host, and a buffer that stores data processed by the processing circuit. The processing buffer circuit may communicate with the host in compliance with a DDR SDRAM standard.

According to an exemplary embodiment, an operating method may be provided for a memory module, which includes a normal memory channel and a processing memory channel, and with each of the normal memory channel and the processing memory channel sharing a router of a processing buffer circuit (and including a memory cell array). This method may include setting an operating mode of the router to one of an extension mode or a mirror mode, based on a mode register set command received from a host. In addition, data stored in the normal memory channel and the processing memory channel is accessed based on an address and a command received from the host and the set operating mode of the router (i.e., extension mode or mirror mode). Then, the accessed data is processed at a processing circuit included in the processing buffer circuit, based on a processing command received from the host. The mode register set command, the address, the command, and the processing command may be transmitted from the host to the memory module in compliance with a DDR SDRAM standard.

According to another exemplary embodiment, a memory module may include a processing buffer chip, and one or more DRAM chips that store data. The one or more DRAM chips may form a normal memory channel and a processing memory channel. The processing buffer chip may include a physical layer that receives a command/address signal and a data signal from a host, as well as a first memory controller and a second memory controller that respectively access the normal memory channel and the processing memory channel based on the command/address signal. A processing circuit is also provided that processes at least a portion of data stored in the normal memory channel accessed through the first memory controller and data stored in the processing memory channel accessed through the second memory controller, based on a processing command included in the data signal. In addition, a buffer is provided that stores data processed by the processing circuit, and a router is provided that receives the command/address signal and the data signal from the physical layer and transmits the command/address signal and the data signal to the first memory controller and the buffer. The processing buffer circuit communicates with the host in compliance with a DDR SDRAM standard.

BRIEF DESCRIPTION OF THE FIGURES

The above and other objects and features of the inventive concept will become apparent by describing in detail exemplary embodiments thereof with reference to the accompanying drawings.

FIG. 8A illustrates cells of a first memory device of FIG. 2, in which data are stored, when complying with the flowchart of FIG. 7.

FIG. 8B illustrates cells of a third memory device of FIG. 2, in which data are stored, when complying with the flowchart of FIG. 7.

FIG. 9A is a flowchart illustrating a portion of an operating method of a memory module, when an operating mode of a router of FIG. 2 is determined as a mirror mode.

DETAILED DESCRIPTION

Below, embodiments of the inventive concept may be described in detail and clearly to such an extent that an ordinary one in the art easily implements the inventive concept. Hereinafter, the best embodiment of the inventive concept will be described in detail with reference to accompanying drawings. With regard to the description of the inventive concept, to make the overall understanding easy, similar components will be marked by similar reference signs/numerals in drawings, and thus, additional description will be omitted to avoid redundancy.

Figure 1:
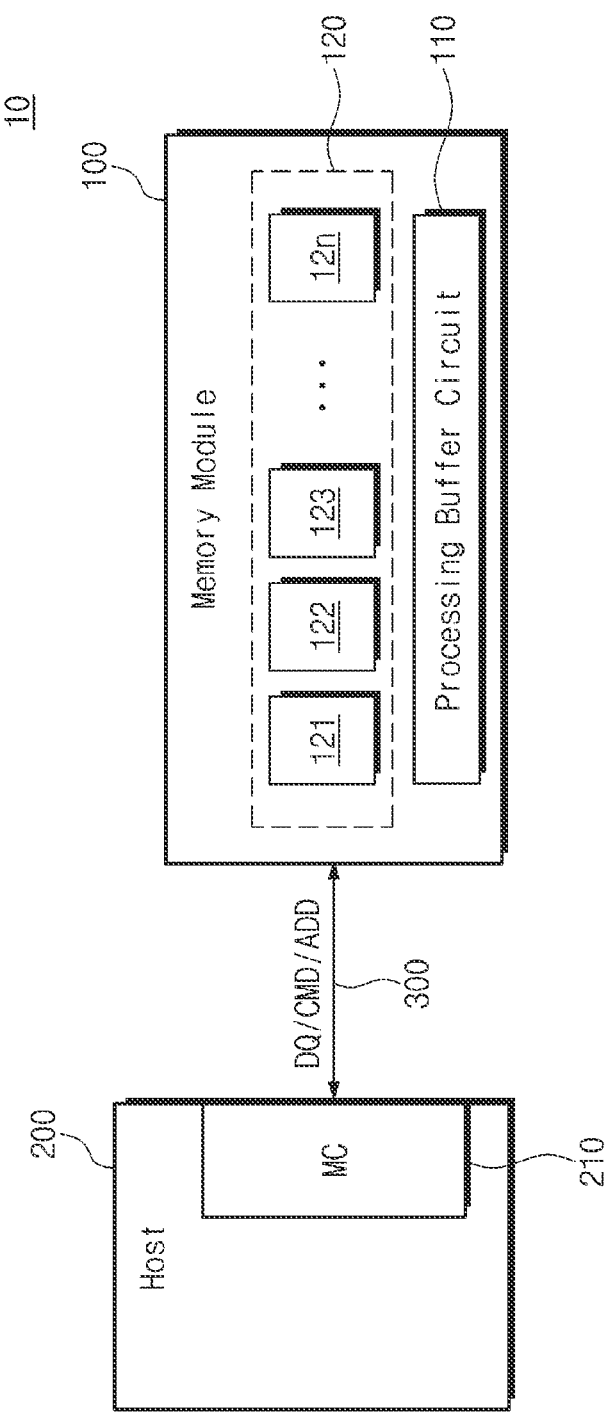
FIG. 1 illustrates a memory system according to an embodiment of the inventive concept.

FIG. 1 illustrates a memory system according to an embodiment of the inventive concept. Referring to FIG. 1, a memory system 10 may include a memory module 100, a host 200, and a connecting line 300. The memory module 100 may include a processing buffer circuit 110 and one or more memory devices 120. The processing buffer circuit 110 may be connected to the memory devices 120. The processing buffer circuit 110 may access storage spaces of the memory devices 120. The processing buffer circuit 110 may process data stored in the memory devices 120 or data received from the host 200, based on a request of the host 200. An operation of the processing buffer circuit 110 will be more fully described later. In an embodiment, the memory module 100 may include a structure capable of performing near data processing (NDP). The memory module 100 may be also referred to as a "process-in-memory (PIM)" or a function-in-memory (FIM)".

An embodiment is illustrated as the number of memory devices 120 is "n" (n being a positive integer greater than one). In other words, the memory module 100 may include first to n-th memory devices 121 to 12n. The number of memory devices 120 included in the memory module 100 is not limited to the illustrated embodiment. Each of the memory devices 120 may include a memory cell array including a plurality of memory cells. In an embodiment, each of the first to n-th memory devices 121 to 12n may be implemented with a dynamic random access memory (DRAM).

The host 200 may be also referred to as a "central processing unit (CPU)". The host 200 may include a memory controller (MC) 210. The host 200 may issue or generate signals for accessing the memory devices 120. For example, the host 200 may generate data to be stored in the memory devices 120 or a data signal DQ indicating an operation to be performed by the processing buffer circuit 110, a command signal CMD directing the memory devices 120 to perform a specific operation such as a read or write operation, and an address signal ADD indicating a physical address of a storage space of each of the memory devices 120. The command signal CMD and the address signal ADD may be collectively referred to as a "command/address signal CA".

A memory controller 210 may transmit the data signal DQ, the command signal CMD, the address signal ADD, etc. generated by the host 200 to the memory module 100 through the connecting line 300. The memory controller 210 may include an address mapping table (not illustrated). The address mapping table of the memory controller 210 may map a virtual address, which the host 200 allocates to the memory module 100, and a physical address of the memory module 100. For example, the address mapping table may store physical addresses respectively corresponding to the first to n-th memory devices 121 to 12n and virtual addresses respectively corresponding to the physical addresses. The host 200 may generate the address signal ADD, based on an address stored in the address mapping table of the memory controller 210.

The memory module 100 may communicate with the memory controller 210 of the host 200 through the connecting line 300. For example, the memory controller 210 may transmit the data signal DQ, the command signal CMD, and the address signal ADD generated by the host 200 to the memory module 100 through the connecting line 300. The connecting line 300 may be implemented in compliance with the double data rate (DDR) standard. For example, the connecting line 300 may satisfy the DDR synchronous DRAM (SDRAM) standard defined by the JEDEC (Joint Electron Device Engineering Council).

In an embodiment, the processing buffer circuit 110 of the memory module 100 may perform an operation directed by a processing command (e.g., CMDP of FIG. 2) included in the data signal DQ received from the host 200 through the connecting line 300. As such, the host 200 may offload an operation to be performed to the processing buffer circuit 110 of the memory module 100 through the connecting line 300 satisfying the DDR SDRAM standard. According to the above description, the memory module 100 may receive a request associated with performing the operation from the host 200 without a separate hardware change.

Figure 2:
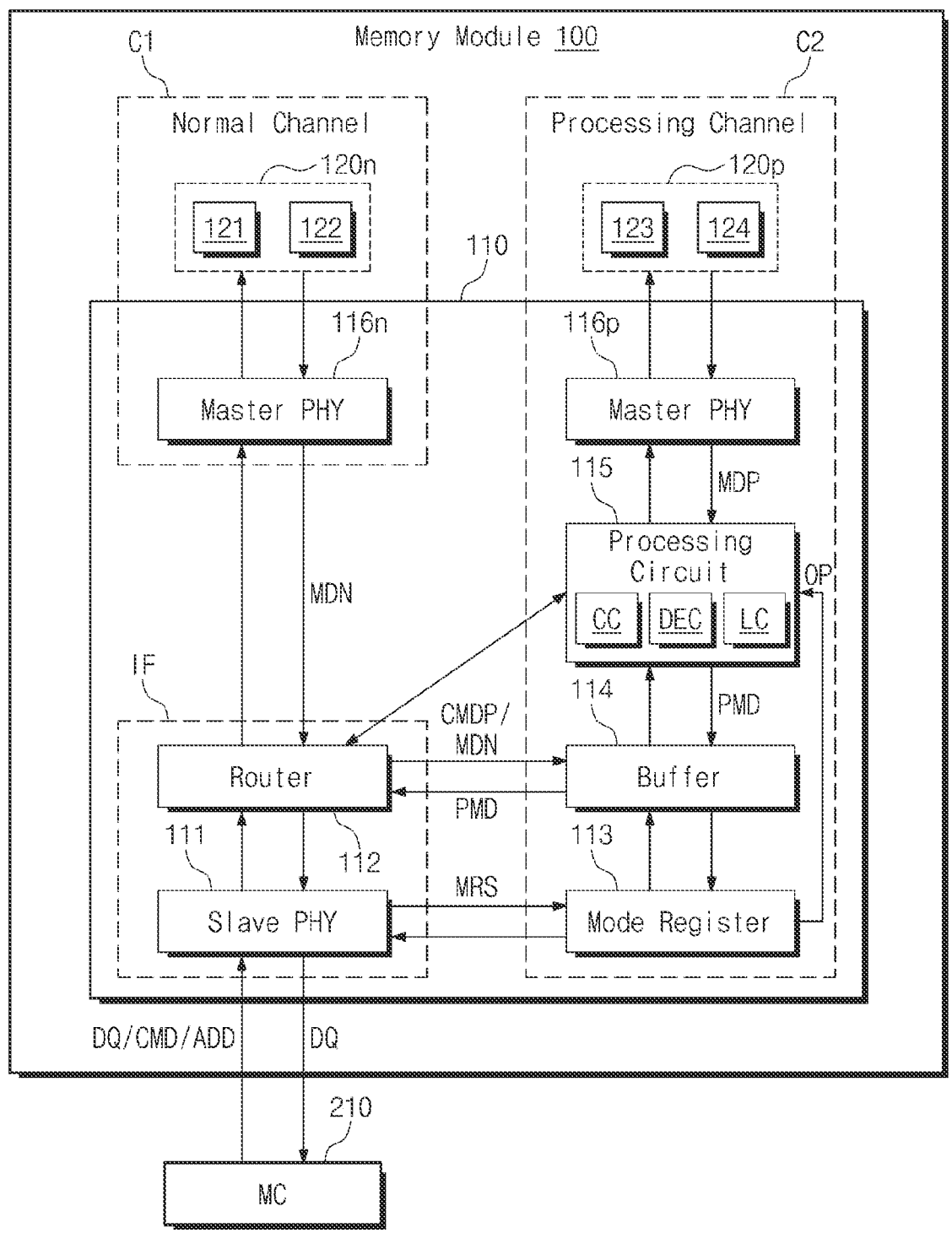
FIG. 2 illustrates a block diagram of a memory module of FIG. 1 in detail.

FIG. 2 illustrates a block diagram of a memory module of FIG. 1 in detail. Referring to FIGS. 1 and 2, the memory module 100 may include the processing buffer circuit 110 and the first to fourth memory devices 121 to 124. Some components belonging to the memory module 100 may be included in a normal channel (or a normal memory channel) C1, and other components thereof may be included in a processing memory channel C2. Other components included in the memory module 100 may be included in an interface unit IF. Components of the normal memory channel C1, the processing memory channel C2, and the interface unit IF will be more fully described hereinbelow.

In an embodiment, at least one memory device of the first to fourth memory devices 121 to 124 may be classified as (or allocated to) the normal memory channel C1, and the other memory devices may be classified as (or allocated to) the processing memory channel C2. An embodiment is illustrated as including the first and second memory devices 121 and 122 within the normal memory channel C1 and the third and fourth memory devices 123 and 124 within the processing memory channel C2. However, a way to classify the first to fourth memory devices 121 to 124 is not limited thereto. For example, the first to fourth memory devices 121 to 124 may be differently classified by a mode register 113. An operation of the mode register 113 will be described more fully hereinbelow.

In an embodiment, each of the normal memory channel C1 and the processing memory channel C2 may include a memory cell array, and the normal memory channel C1 and the processing memory channel C2 may share some components (e.g., the interface unit IF) of the processing buffer circuit 110. In another embodiment, each of the normal memory channel C1 and the processing memory channel C2 may include at least one or more memory devices and at least some components of the processing buffer circuit 110. For example, the processing memory channel C2 may include the mode register 113, a buffer 114, a processing circuit 115, a master physical layer 116p, and memory devices 120p classified as the processing memory channel C2. For another example, the normal memory channel C1 may include a master physical layer 116n and memory devices 120n classified as the normal memory channel C1. The memory devices 120n and 120p may be disposed at ends of the normal memory channel C1 and the processing memory channel C2, respectively.

The processing buffer circuit 110 may include a slave physical layer 111, a router 112, the mode register 113, the buffer 114, and one or more master physical layers 116n and 116p. The master physical layers 116n and 116p may be also referred to as a "memory controller". The interface unit IF of the processing buffer circuit 110 may include the slave physical layer 111 and the router 112.

The slave physical layer 111 may be connected to the memory controller 210 of the host 200 through the connecting line 300. The slave physical layer 111 may receive the data signal DQ, the command signal CMD, and the address signal ADD from the memory controller 210 of the host 200. The slave physical layer 111 may remove signal noise included in the data signal DQ, the command signal CMD, and the address signal ADD thus received. For example, the slave physical layer 111 may perform retiming or sampling on the data signal DQ, the command signal CMD, and the address signal ADD thus received. The slave physical layer 111 may transmit noise-free signals to the router 112 and the mode register 113.

The router 112 may allow the host 200 to access the memory devices 120n classified as the normal memory channel C1 and the memory devices 120p classified as the processing memory channel C2, based on the address signal ADD, the noise of which is removed by the slave physical layer 111. For example, the router 112 may provide the host 200 with storage spaces of the memory devices 120n and 120p and the buffer 114 as an access target. With regard to data stored in one of the memory devices 120, the router 112 may determine whether a normal operation such as a data read/write operation is performed or whether a separate operation (or data processing) is performed using the processing circuit 115.

In an embodiment, the router 112 may operate in one of an extension mode or a mirror mode. An operating mode of the router 112 will be more fully described later.

The mode register 113 may store information about an operating condition of the memory module 100 depending on a request of the host 200. The host 200 may set the operating mode of the memory module 100 by issuing the command signal CMD including a mode register set command MRS for setting an operation of the mode register 113. The mode register set command MRS may be transmitted to the mode register 113 through the slave physical layer 111 in the form of a digital signal.

In an embodiment, the mode register 113 may further include a register circuit for storing information about a normal command (e.g., a burst length set command) for controlling a memory module including a DRAM and a register circuit for storing information about an operating mode of the processing circuit 115. In this case, the mode register set command MRS may further include a command for setting an operating mode of the router 112, a command for setting an operating mode of the processing circuit 115 or for permitting all or a part of operations of the processing circuit 115, etc.

The processing circuit 115 may read an operating signal OP stored in the mode register 113 through the mode register set command MRS. The operating signal OP may be a signal associated with a command for setting an operating mode of the processing circuit 115. In an embodiment, the processing circuit 115 may activate or deactivate the whole processing circuit 115 or a portion of the processing circuit 115 in response to information stored in the mode register 113 through the mode register set command MRS. An operation of the processing circuit 115 will be more fully described later.

The router 112 may operate in one of the extension mode or the mirror mode, based on information stored in the mode register 113 through the mode register set command MRS. An embodiment is illustrated, for ease of illustration, as a connecting line between the router 112 and the mode register 113 is omitted. In an embodiment, the router 112 may reconfigure (or change) settings (or configurations) of the memory devices 120n and 120p capable of being accessed by the host 200 depending on information stored in the mode register 113 through the mode register set command MRS. For example, the router 112 may classify at least one of the first to fourth memory devices 121 to 124 as the normal memory channel C1 and the remaining memory devices as the processing memory channel C2, in response to the information stored in the mode register 113. According to the above description, the host 200 may change a configuration of the normal memory channel C1 and the processing memory channel C2 by issuing the mode register set command MRS.

The buffer 114 may store information about an operation to be performed by the processing circuit 115, data MDN stored in the memory devices 120n classified as the normal memory channel C1, and data PMD processed by the processing circuit 115. For example, the buffer 114 may receive a processing command CMDP and the data MDN from the router 112. And, in response, the buffer 114 may provide the processing circuit 115 with the processing command CMDP and the data MDN thus received. In an embodiment, the processing command CMDP that is included in the data signal DQ may be transmitted from the host 200 to the memory module 100. This processing command CMDP may be included in a burst of the data signal DQ in the form of a series of packets complying with a given format.

For example, the processing command CMDP may include an operation code (OP code) indicating a kind of an operation to be performed by the processing circuit 115, a code src indicating an address of a source, a code dest (or dst) indicating an address of a destination, etc. According to the above description, the host 200 may offload an operation to be performed by the processing circuit 115 to the processing circuit 115 by requesting an operation of writing the processing command CMDP in the buffer 114 (or issuing the command signal CMD including a write command) without further transmitting a separate command signal to the memory module 100.

The processing circuit 115 may process at least one of data received from the host 200 or data stored in the memory devices 120n and 120p based on the processing command CMDP stored in the buffer 114. The processing circuit 115 may be also referred to as a "processor". The processing circuit 115 may include a decoder circuit DEC, a communication circuit CC, and a logic circuit LC, in some embodiments.

The decoder circuit DEC may decode the processing command CMDP received from the host 200. The communication circuit CC may perform data (or signal) communication. For example, the communication circuit CC may receive data stored in the buffer 114 from the buffer 114. The communication circuit CC may receive the data MDP stored in the memory devices 120p. The communication circuit CC may transmit the data PMD processed by the processing circuit 115 to the buffer 114 or the master physical layer 116p. The communication circuit CC may transmit the data MDP received from the memory devices 120p to the buffer 114.

The logic circuit LC may perform an operation based on the processing command CMDP. For example, the logic circuit LC may include a logic circuit such as a multiply-accumulate operation (MAC) unit, a rectified linear unit (ReLu), or an arithmetic logic unit (ALU). The logic circuit LC may perform an operation requested from the host 200, based on a result of decoding the processing command CMDP.

In an embodiment, the processing circuit 115 may access the data MDN stored in the memory devices 120n classified as the normal memory channel C1. For example, the router 112 may provide the processing circuit 115 with the data MDN stored in the memory devices 120n classified as the normal memory channel C1, based on the command signal CMD and the address signal ADD received from the host 200. Accordingly, without any additional data handling of the host 200, the processing circuit 115 may perform operations on data stored in the memory devices 120n classified as the normal memory channel C1, as well as data stored in the memory devices 120p classified as the processing memory channel C2.

In another embodiment, the processing circuit 115 may scrub the memory devices 120. For example, the processing circuit 115 may scrub the memory devices 120 in response to a scrub request received from the host 200 in a state of being included in the processing command CMDP. For another example, the processing circuit 115 may periodically scrub the memory devices 120. In this case, a period where the processing circuit 115 scrubs the memory devices 120 may be determined in advance when the memory module 100 is manufactured or may be determined by the host 200.

The processing circuit 115 may transmit the data PMD processed by the logic circuit LC to the buffer 114. The host 200 may access the data PMD processed by the processing circuit 115 by transmitting a read request for the processed data PMD stored in the buffer 114 to the memory module 100. The processed data PMD stored in the buffer 114 may be transmitted to the router 112 in response to a read request of the host 200. The router 112 may provide the host 200 with a storage space of the buffer 114 as an access target.

The master physical layers 116n and 116p may be respectively connected to the memory devices 120n and 120p. The master physical layers 116n and 116p may receive the data signal DQ, the command signal CMD, and the address signal ADD from the router 112 through the processing circuit 115, based on an operating mode of the router 112. The master physical layers 116n and 116p may transmit at least a part of digital signals used by respective components of the processing buffer circuit 110 to the memory devices 120n and 120p, respectively.

The master physical layers 116n and 116p may receive signals associated with data stored in the memory devices 120n and 120p from the memory devices 120n and 120p, respectively. The master physical layers 116n and 116p may receive noise associated with the received signals. The master physical layers 116n and 116p may transmit noise-free signals to at least a part of the components of the processing buffer circuit 110. As such, the host 200 and the processing circuit 115 may access storage spaces of the memory devices 120n and 120p disposed at the ends of the normal memory channel C1 and the processing memory channel C2 through the master physical layers 116n and 116p, respectively.

Figure 3:
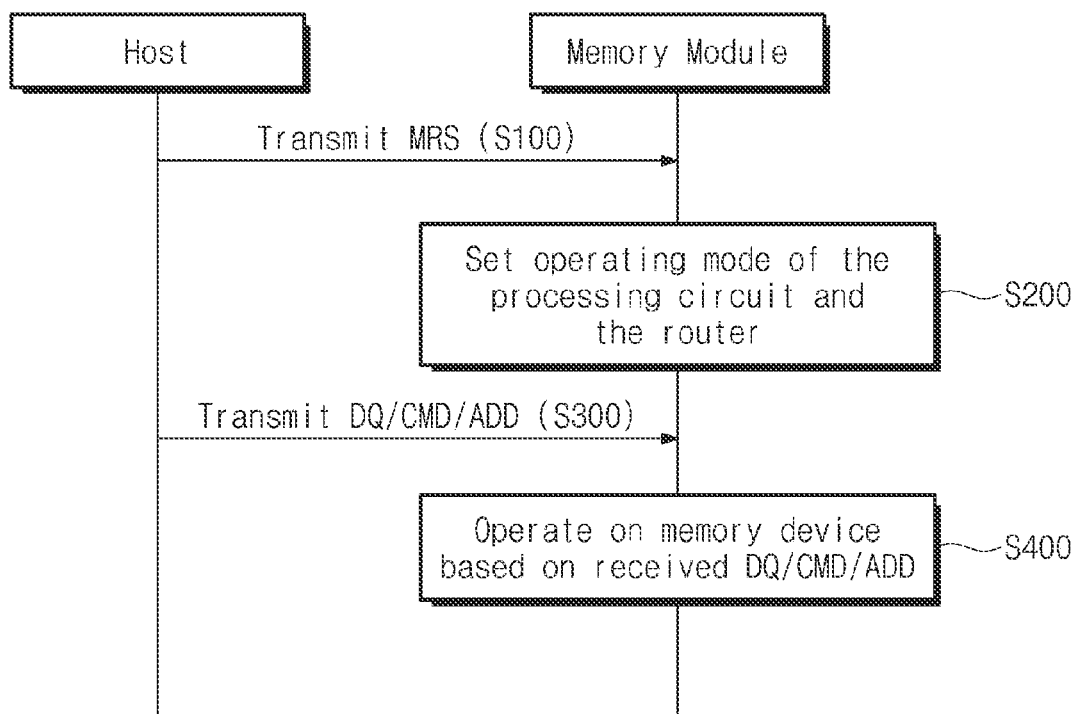
FIG. 3 is a flowchart illustrating an operating method of a memory system of FIG.

FIG. 3 is a flowchart illustrating an operating method of a memory system of FIG. 1. Referring to FIGS. 1 to 3, the host 200 of the memory system 10 may perform operation S100 and operation 300, and the memory module 100 of the memory system 10 may perform operation S200 and operation S400. In operation S100, the host 200 may transmit the mode register set command MRS for setting the mode register 113 to the memory module 100. In an embodiment, operation S100 may be performed in an initialization operation after a power-on of the host 200.

In operation S200, the memory module 100 may set an operating mode of the processing circuit 115 and the router 112 of the processing buffer circuit 110. For example, the memory module 100 may store the mode register set command MRS in the mode register 113. The processing circuit 115 may read the operating signal OP that is stored in the mode register 113 through the mode register set command MRS and is used to activate or deactivate a part of the processing circuit 115. The router 112 may operate in the extension mode or the mirror mode, based on an active state of the processing circuit 115 and a request of the host 200.

In operation S300, the host 200 may transmit the data signal DQ, the command signal CMD, and the address signal ADD to the memory module 100. In operation S400, the memory module 100 may operate on the memory devices 120. For example, the memory module 100 may access the memory devices 120, based on the operating mode of the processing circuit 115 and the router 112 set in operation S200 and the request of the host 200. The memory module 100 may perform an operation requested by the host 200 on at least a part of the memory devices 120, based on the data signal DQ, the command signal CMD, and the address signal ADD received from the host 200.

Figure 4A:
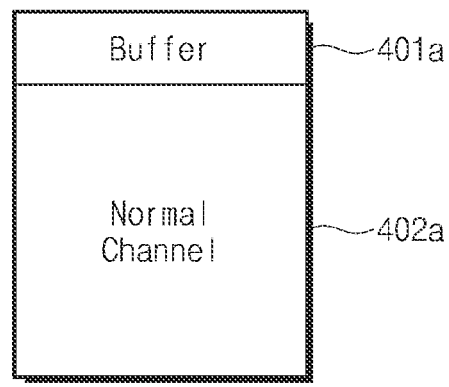
FIG. 4A illustrates a memory map of a memory controller of FIG. 1 when a router of FIG. 2 is in the mirror mode.
Figure 4B:
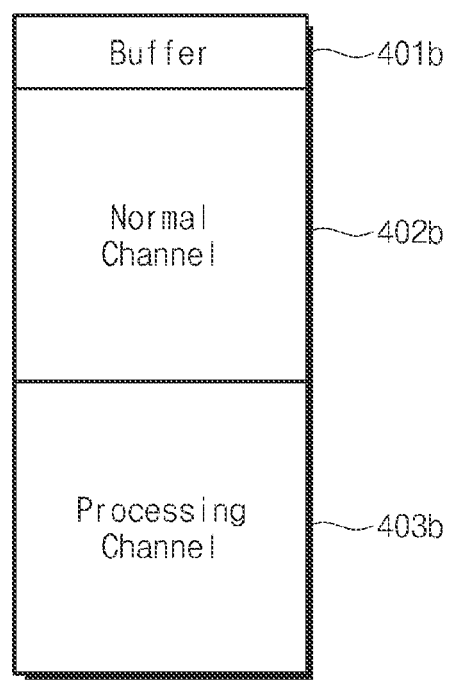
FIG. 4B illustrates a memory map of a memory controller of FIG. 1 when a router of FIG. 2 is in the extension mode.

FIG. 4A illustrates a memory map of a memory controller of FIG. 1 when a router of FIG. 2 is in the mirror mode. FIG. 4B illustrates a memory map of a memory controller of FIG. 1 when a router of FIG. 2 is in the extension mode. In other words, FIGS. 4A and 4B illustrate memory maps of the memory devices 120 seen from the host 200 in the mirror mode and the extension mode, respectively. FIGS. 4A and 4B will be described with reference to FIGS. 1 to 3.

When the router 112 operates in the mirror mode, the router 112 may provide the host 200 with storage spaces of the memory devices 120n classified as the normal memory channel C1 and a storage space of the buffer 114 as an access target. As such, the memory map stored in the memory controller 210 may include a region 401a for the storage space of the buffer 114 and a region 402a for the storage spaces of the memory devices 120n classified as the normal memory channel C1, as illustrated in FIG. 4A. An operation of the memory system 10 when the router 112 operates in the mirror mode will be more fully described with reference to FIGS. 5 and 7.

When the router 112 operates in the extension mode, the router 112 may provide the host 200 with a storage space of at least a part (e.g., 123) of the memory devices 120p classified as the processing memory channel C2 and the storage space of the buffer 114, as an access target, as well as the storage spaces of the memory devices 120n classified as the normal memory channel C1. As such, the memory map stored in the memory controller 210 may include a region 401b for the storage space of the buffer 114, a region 402b for the storage spaces of the memory devices 120n classified as the normal memory channel C1, and a region 403b for the storage spaces of the memory devices 120p classified as the processing memory channel C2, as illustrated in FIG. 4B. An operation of the memory system 10 when the router 112 operates in the extension mode will be more fully described with reference to FIG. 6.

Figure 5:
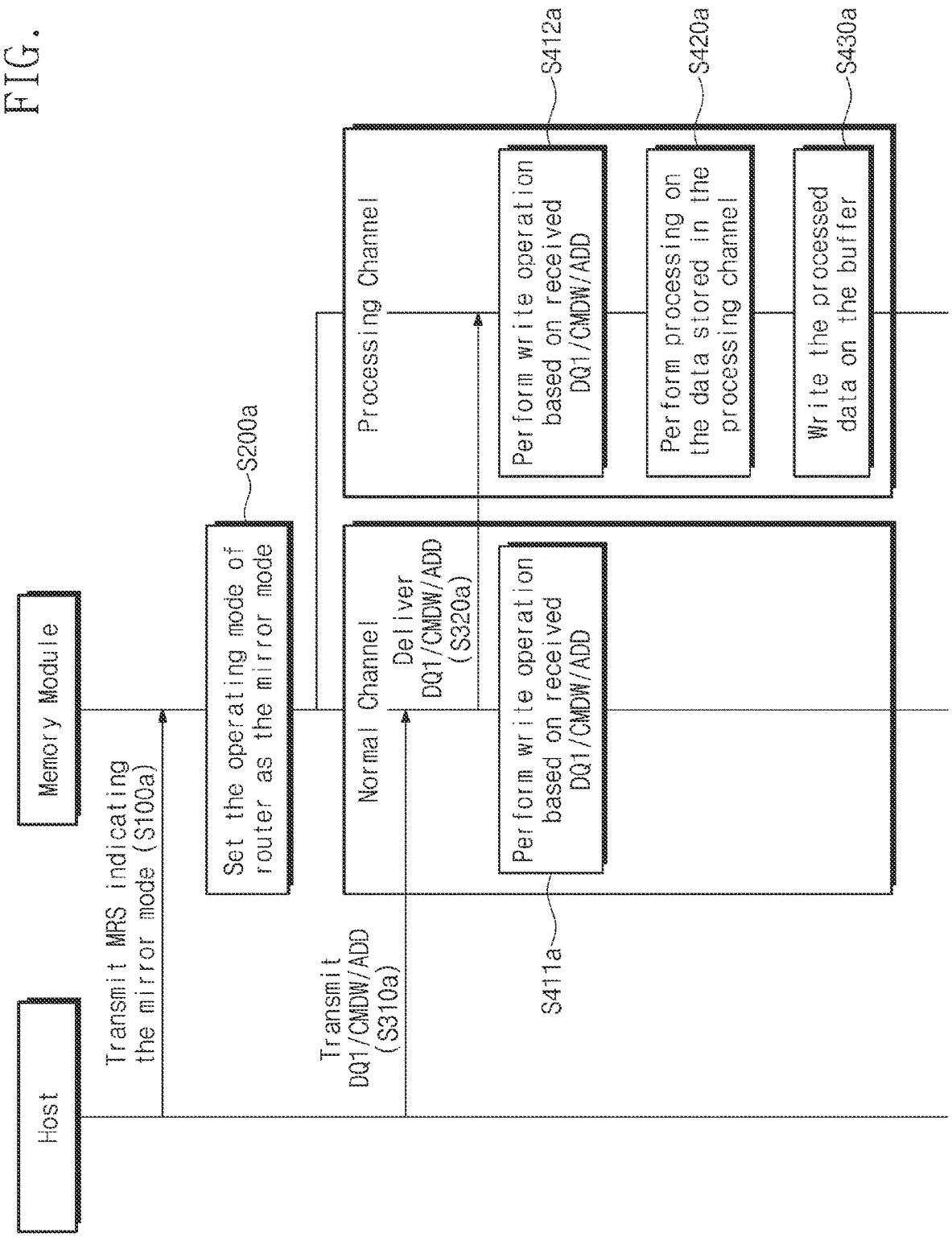
FIG. 5 is a flowchart illustrating an operating method of a memory system of FIG. 1 when an operating mode of a router of FIG. 2 is determined as a mirror mode.

FIG. 5 is a flowchart illustrating an operating method of a memory system of FIG. 1 when an operating mode of a router of FIG. 2 is determined as a mirror mode. Referring to FIGS. 1 to 3 and 6, the host 200 may perform operation S100a and operation S310a, and the memory module 100 may perform operation S200a, operation S320a, operation S411a, operation S412a, operation S420a, and operation S430a. In the mirror mode, the same data as data to be stored in the storage spaces of the memory devices 120n classified as the normal memory channel C1 may be stored in the storage spaces of the memory devices 120p classified as the processing memory channel C2. Data that correspond to data stored in the memory devices 120n classified as the normal memory channel C1 and are stored in the memory devices 120p classified as the processing memory channel C2 may be also referred to as "mirror data".

In operation S100a, the host 200 may transmit the mode register set command MRS, which directs the router 112 to operate in the mirror mode, to the memory module 100. For example, the mode register set command MRS may include a command that allows the router 112 to operate in the mirror mode and allows the memory devices 120 to be classified as one of the normal memory channel C1 or the processing memory channel C2.

In operation S200a, the memory module 100 may set an operating mode of the processing circuit 115 and the router 112 of the processing buffer circuit 110. The router 112 may operate in the mirror mode in response to the mode register set command MRS. In other words, the router 112 may provide the host 200 only with storage spaces of the memory devices 120n classified as the normal memory channel C1 and a storage space of the buffer 114 as an access target.

In operation S310a, the host 200 may generate a first data signal DQ1, a write command signal CMDW, and the address signal ADD and may transmit the first data signal DQ1, the write command signal CMDW, and the address signal ADD to the memory module 100. For example, the write command signal CMDW may include a command directing writing data included in the first data signal DQ1 in at least a part of the memory devices 120. In operation S320a, the memory module 100 may be configured to deliver an access of the host 200 to data stored in the memory devices 120n classified as the normal memory channel C1 to the processing memory channel C2.

In an embodiment, the router 112 may receive a request for accessing the storage spaces of the memory devices 120n classified as the normal memory channel C1 from the host 200. In this case, the router 112 may transmit the received request (e.g., the first data signal DQ1, the write command signal CMDW, and the address signal ADD) of the host 200 to the processing memory channel C2. The processing memory channel C2 may write the first data signal DQ1, the write command signal CMDW, and the address signal ADD in the buffer 114.

In operation S411a, the normal memory channel C1 may perform a write operation based on the first data signal DQ1, the write command signal CMDW, and the address signal ADD thus received. For example, data based on the first data signal DQ1 may be written in the storage spaces of the memory devices 120n, which corresponds to the address signal ADD.

In operation S412a, the processing memory channel C2 may perform a write operation based on the first data signal DQ1, the write command signal CMDW, and the address signal ADD thus received. For example, data based on the first data signal DQ1 may be written in the storage spaces of the memory devices 120p, which corresponds to the address signal ADD. As such, data that are requested from the host 200 so as to be written may be stored in each of the normal memory channel C1 and the processing memory channel C2.

In operation S420a, the memory module 100 may perform an operation on the mirror data, based on the processing command CMDP. For example, the processing circuit 115 may read, write, or process the mirror data stored in the memory devices 120p, based on a result of decoding the processing command CMDP written in the buffer 114. Moreover, even though the host 200 accesses the storage spaces of the memory devices 120n classified as the normal memory channel C1, the processing circuit 115 may simultaneously access the mirror data. In other words, by using a bandwidth in the memory module 100, which is independent of the host 200, the processing circuit 115 may access the same data as data accessed by the host 200 and may perform processing on the same data.

In operation S430a, the memory module 100 may write the data processed in operation 420a in the buffer 114. For example, the processing circuit 115 may transmit the processed data PMD, which are generated as a result of processing the mirror data, to the buffer 114. The buffer 114 may store the processed data PMD received from the processing circuit 115, and may provide the stored processed data PMD to the host 200 in response to a read request for the processed data PMD. As such, the host 200 may read the data PMD processed by the processing circuit 115 by accessing a specific storage space of the buffer 114.

Figure 6:
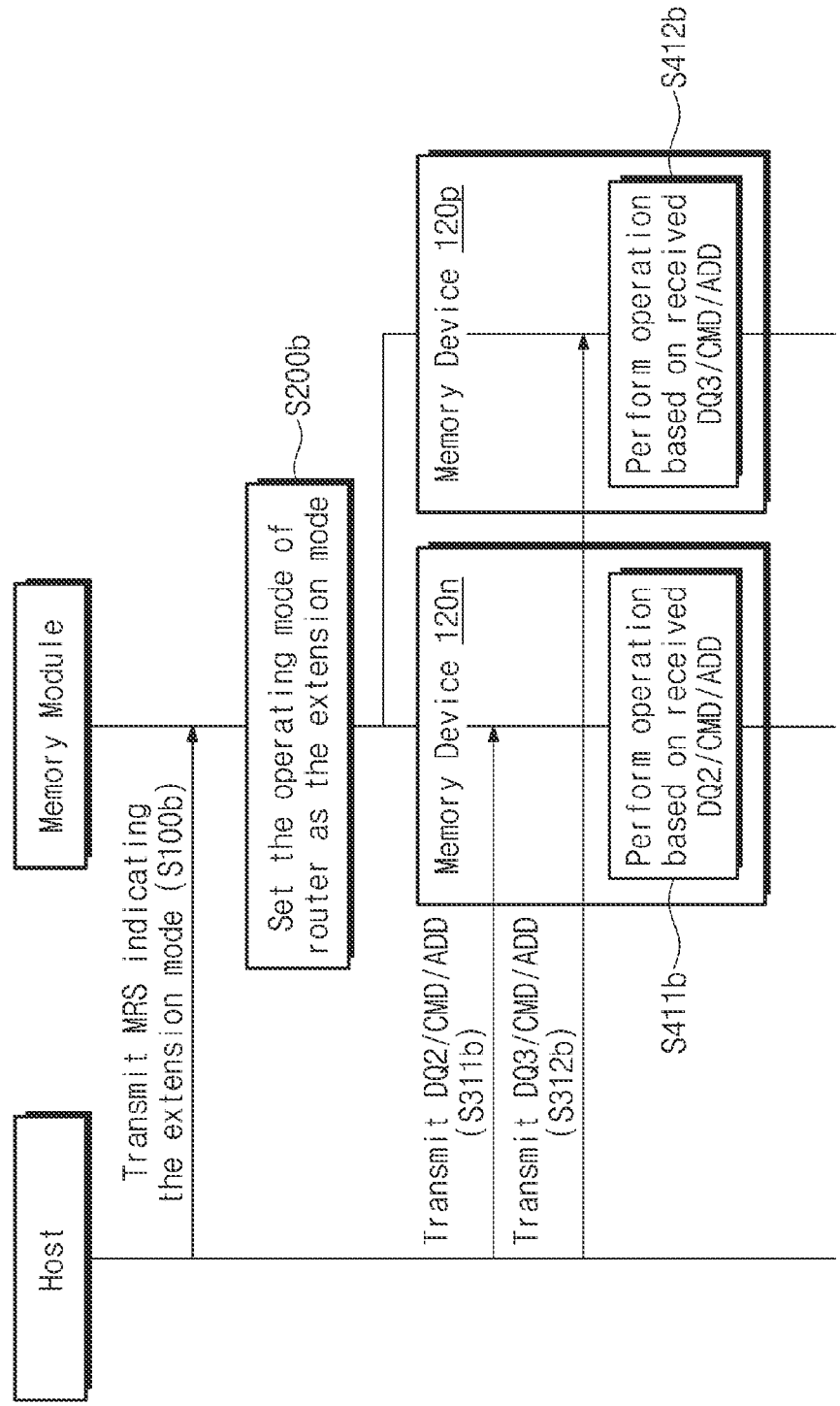
FIG. 6 is a flowchart illustrating an operating method of a memory system of FIG. 1 when an operating mode of a router of FIG. 2 is determined as an extension mode.

FIG. 6 is a flowchart illustrating an operating method of a memory system of FIG. 1 when an operating mode of a router of FIG. 2 is determined as an extension mode. Referring to FIGS. 1 to 3 and 6, the host 200 of the memory system 10 may perform operation S100b, operation S311b, and operation S312b, and the memory module 100 of the memory system 10 may perform operation S200b, operation S411b, and operation S412b.

In operation S100b, the host 200 may transmit the mode register set command MRS, which directs the router 112 to operate in the extension mode, to the memory module 100. For example, the mode register set command MRS may include a command that allows the router 112 to operate in the extension mode, allows the memory devices 120 to be classified as one of the normal memory channel C1 or the processing memory channel C2, and is used to control an operating time and an active state of the logic circuit LC of the processing circuit 115.

In operation S200b, the memory module 100 may set an operating mode of the processing circuit 115 and the router 112 of the processing buffer circuit 110. The router 112 may operate in the extension mode in response to the mode register set command MRS. An operation of the processing circuit 115 may be determined depending on the amount of storage spaces of the memory devices 120p exposed to the host 200 through the router 112. In an embodiment, the router 112 may provide the host 200 with all the storage spaces of the memory devices 120p as an access target. In other words, through the router 112, the first to n-th memory devices 121 to 12n may be exposed to or recognized by the host 200 as one integrated high-capacity memory. In this case, the host 200 may monopolize the first to n-th memory devices 121 to 12*n*, or the host 200 may share the first to n-th memory devices 121 to 12*n* with the processing circuit 115.

In the case where the first to n-th memory devices 121 to 12*n* are monopolized by the host 200, the mode register 113 may deactivate the logic circuit LC of the processing circuit 115. For example, a power that is supplied to the logic circuit LC of the processing circuit 115 may be blocked by the operating signal OP that is readable by the processing circuit 115. As such, an operation that the processing circuit 115 performs on data stored in the memory devices 120 may be inhibited. However, even in this case, a path (e.g., the communication circuit CC) for data communication of the processing circuit 115 may be still activated. Accordingly, data stored in the memory devices 120*p* may be provided to the host 200 through the path for the data communication of the processing circuit 115, the buffer 114, and the router 112.

In another embodiment, in the case where the memory devices 120 are shared by the host 200 and the processing circuit 115, a time interval where the logic circuit LC of the processing circuit 115 is activated may be determined based on the mode register set command MRS. In this case, the processing circuit 115 may perform calculation appointed (or determined or stored) in advance on data stored in the memory devices 120. For example, the host 200 may provide the processing circuit 115 with the mode register set command MRS including a command that permits the logic circuit LC of the processing circuit 115 and the host 200 to access the storage spaces of the memory devices 120 at different times. As such, the processing circuit 115 may access the storage spaces of the memory devices 120 only in a time interval permitted by the host 200.

The time interval where the processing circuit 115 is capable of accessing the storage spaces of the memory devices 120 may be determined by the host 200 when an operating mode of the router 112 is determined. Alternatively, the host 200 may control an operation of the processing circuit 115 by issuing the command signal CMD including information about a time interval where the processing circuit 115 is capable of accessing the storage spaces of the first to n-th memory devices 121 to 12*n*.

In another embodiment, the router 112 may provide the host 200 with all the storage spaces of the memory devices 120*n* and only a portion of the storage spaces of the memory devices 120*p* as an access target. In this alternative case, the remaining storage spaces of the memory devices 120*p*, which is not provided to the host 200 as an access target, may be accessed only by the processing circuit 115. The processing circuit 115 may access the remaining storage spaces of the memory devices 120*p*, which is not provided to the host 200 as an access target, based on the processing command CMDP. In this case, a partial storage space of the memory devices 120, which is accessed by the host 200, may be monopolized by the host 200 or may be shared by the processing circuit 115 and the host 200.

In the case where the partial storage space of the memory devices 120, which is capable of being accessed by the host 200, is monopolized by the host 200, the processing circuit 115 may restrictively access the storage space monopolized by the host 200. For example, when the host 200 accesses the storage space monopolized by the host 200, the processing circuit 115 may fail to access the monopolized storage space at the same time with the host 200. In other words, the processing circuit 115 may access the storage space monopolized by the host 200 only in a time interval permitted by the host 200. In this case, the host 200 may permit the use of the logic circuit LC of the processing circuit 115 by requesting the buffer 114 to write the processing command CMDP. Accordingly, in the case where the use of the logic circuit LC of the processing circuit 115 is permitted by the host 200, the processing circuit 115 may access the storage space monopolized by the host 200, based on the processing command CMDP written in the buffer 114.

In the case where a partial storage space of the memory devices 120, which is capable of being accessed by the host 200, is shared by the processing circuit 115 and the host 200, in a scheme similar to that in the case where all the storage spaces of the memory devices 120 are shared, the processing circuit 115 may access the partial storage space of the memory devices 120, which is capable of being accessed by the host 200. For example, the processing circuit 115 may access the partial storage space of the memory devices 120, which is capable of being accessed by the host 200, at a time different from that of the host 200. In other words, the processing circuit 115 may access the shared storage space in a time interval permitted by the host 200, so that the processing circuit 115 may perform calculation appointed in advance on data stored in the shared storage space.

In operation S311*b*, the host 200 may generate a second data signal DQ2, the command signal CMD, and the address signal ADD and may transmit the second data signal DQ2, the command signal CMD, and the address signal ADD to the memory module 100. The second data signal DQ2, the command signal CMD, and the address signal ADD received from the host 200 may be provided to the memory devices 120*n* classified as the normal memory channel C1. And, in operation S312*b*, the host 200 may generate a third data signal DQ3 and may transmit the third data signal DQ3, the command signal CMD, and the address signal ADD to the memory module 100. The third data signal DQ3, the command signal CMD, and the address signal ADD received from the host 200 may be provided to the memory devices 120*p* classified as the processing memory channel C2. In this case, memory devices to which the third data signal DQ3, the command signal CMD, and the address signal ADD received from the host 200 are provided may be included in memory devices permitted by the host 200 so as to be accessed. In an embodiment, operation S311*b* and operation S312*b* may be performed at the same time.

In operation S411*b*, the memory module 100 may perform an operation based on the second data signal DQ2, the command signal CMD, and the address signal ADD, on the memory devices 120*n* classified as the normal memory channel C1. For example, the memory module 100 may write data included in the second data signal DQ2 in the storage spaces of the memory devices 120*n*, which corresponds to the address signal ADD. For another example, the memory module 100 may read data stored in the storage spaces of the memory devices 120*n*, which corresponds to the address signal ADD.

In operation S412*b*, the memory module 100 may perform an operation based on the third data signal DQ3, the command signal CMD, and the address signal ADD, on the memory devices 120*p* classified as the processing memory channel C2. For example, the memory module 100 may write data included in the third data signal DQ3 in the storage spaces of the memory devices 120*p*, which corresponds to the address signal ADD. For another example, the memory module 100 may read data stored in the storage spaces of the memory devices 120*p*, which corresponds to the address signal ADD.

For another example, the processing buffer circuit 110 of the memory module 100 may perform an operation on the data MDN/MDP stored in the memory module 100 or the data included in the third data signal DQ3, based on the processing command CMDP included in the command signal CMD.

In operation S412b, a storage space capable of being accessed by the processing circuit 115 may be extended to the memory devices 120n classified as the normal memory channel, in addition to the memory devices 120p classified as the processing memory channel. As such, the processing circuit 115 may perform an operation on a larger data set than in the case where the storage space capable of being accessed by the processing circuit 115 is limited to the memory devices 120p classified as the processing memory channel.

Figure 7:
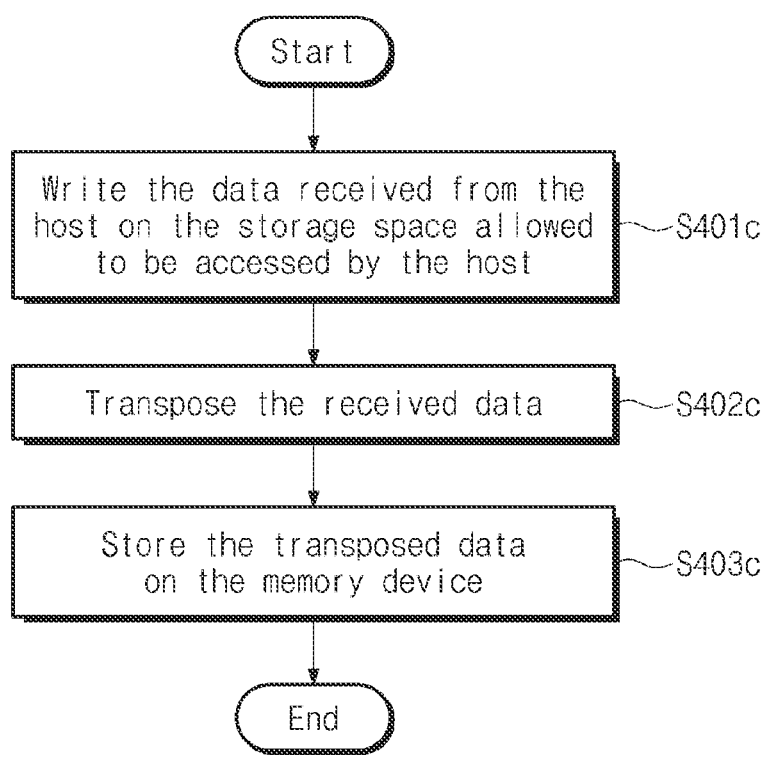
FIG. 7 illustrates a flowchart of an operating method of a memory module of FIG. 1 according to an embodiment of the inventive concept.

FIG. 7 illustrates a flowchart of an operating method of a memory module of FIG. 1 according to an embodiment of the inventive concept. In detail, according to an embodiment of the inventive concept, a flowchart of a method in which the memory module 100 pre-processes data to accelerate a convolutional neural network (CNN) operation is illustrated in FIG. 7. Referring to FIGS. 1 to 3 and 5 to 7, the memory module 100 may perform operation S401c to operation S403c.

In operation S401c, the memory module 100 may store data received from the host 200 in a memory device permitted to be accessed by the host 200. For example, in the case where the router 112 operates in the extension mode, the memory module 100 may store the data received from the host 200 in a storage space permitted to be accessed by the host 200. For another example, in the case where the router 112 operates in the mirror mode, the memory module 100 may store the data received from the host 200 in the memory devices 120n classified as the normal memory channel C1.

In operation S402c, the memory module 100 may transpose all or a part of the data received from the host 200. For example, the processing circuit 115 may transpose data that are determined by the host 200 as pre-processing is required.

In operation S403c, the transposed data may be stored in the memory devices 120p classified as the processing memory channel C2 or in the buffer 114. For example, when the router 112 operates in the extension mode, all the storage spaces of the memory devices 120 may be provided to the host 200 and the processing circuit 115 as an access target. In this case, the processing circuit 115 may store the transposed data in any storage space of the memory devices 120 or in the buffer 114.

Alternatively, when the router 112 operates in the extension mode, only a portion of the storage spaces of the memory devices 120p classified as the processing memory channel C2 may be provided to the host 200 as an access target. In this case, the processing circuit 115 may store the transposed data in a storage space, which is monopolized by the processing circuit 115, from among the storage spaces of the memory devices 120p. The transposed data stored in the storage space monopolized by the processing circuit 115 may be stored in the buffer 114 in response to a read request for the pre-processed data, which is provided from the host 200. The host 200 may read the transposed data by accessing the storage space of the buffer 114.

According to another embodiment, when the router 112 operates in the extension mode, the processing circuit 115 may store the transposed data in the buffer 114. The host 200 may read the transposed data by accessing the storage space of the buffer 114. Also, when the router 112 operates in the mirror mode, only a portion of the storage spaces of the memory devices 120n classified as the normal memory channel C1 may be provided to the host 200 as an access target. In this case, the processing circuit 115 may store the transposed data in storage spaces of the memory devices 120p classified as the processing memory channel C2. The pre-processed data stored in the storage spaces of the memory devices 120p may be stored in the buffer 114 in response to a read request for the transposed data, which is provided from the host 200. The host 200 may read the transposed data by accessing the storage space of the buffer 114. When the router 112 operates in the mirror mode, data may be transposed by the processing circuit 115 regardless of whether the host 200 accesses the memory devices 120n. Accordingly, a speed at which data are pre-processed may be improved compared to when the router 112 operates in the extension mode.

FIG. 8A illustrates cells of a first memory device of FIG. 2, in which data are stored, when complying with the flowchart of FIG. 7. FIG. 8B illustrates cells of a third memory device of FIG. 2, in which data are stored, when complying with the flowchart of FIG. 7. Referring to FIGS. 1 to 3, 5 to 7, 8A, and 8B, a first memory device 121a may be one of the memory devices 120n classified as the normal memory channel C1. A third memory device 123a may be one of the memory devices 120p classified as the processing memory channel C2.

Data received from the host 200 may be stored in a memory cell array of the first memory device 121a in the form of a matrix as illustrated in FIG. 8A. The processing circuit 115 may transpose data of a matrix form illustrated in FIG. 8A. That is, a data cell D12 and a data cell D21 of FIG. 8A may be stored in the memory cell array of the third memory device 123a such that locations thereof are changed, as illustrated in FIG. 8B. Afterwards, the processing circuit 115 may provide the transposed data to the host 200 through the buffer 114 in response to a read request of the host 200.

Data received from the host 200 may be in the form of a k×l matrix, where k and l are positive integers. In this case, to perform the CNN operation on data stored in a memory device, there may be a need to an access data of a p-th row (p being a positive integer equal to or less than k) and data of a q-th column (q being a positive integer equal to or less than l). The host 200 may read data a total of k times for the purpose of accessing the data of the q-th column. In contrast, as illustrated in FIG. 8B, in the case where data are transposed, the data of the q-th column illustrated in FIG. 8A may be accessed by accessing data of a q-th row belonging to the transposed data. As a result, the host 200 may read desired data through only one access. This may mean that the performance of the CNN operation performed by the host 200 is improved by the memory module 100.

In an embodiment, the processing circuit 115 may perform the CNN operation by using the transposed data. The processing circuit 115 may read at least a portion of the data MDN stored in the memory devices 120n classified as the normal memory channel C1 and the data MDP stored in the memory devices 120p classified as the processing memory channel C2. The processing circuit 115 may perform the CNN operation on the read data and the transposed data. The processing circuit 115 may store a result of the CNN operation in the buffer 114. The memory module 100 may output the result of the CNN operation stored in the buffer 114 in response to a read request of the host 200. In the above example, the host 200 may transmit, to the memory module 100, data targeted for the CNN operation and the processing command CMDP directing performing the CNN operation. As such, the host 200 may offload the CNN operation to the processing circuit 115.

FIG. 9A is a flowchart illustrating a portion of an operating method of a memory module, when an operating mode of a router of FIG. 2 is determined as a mirror mode. Referring to FIGS. 1, 2, and 9A, the memory module 100 may perform operation S510a to operation S530a. In operation S510a, the memory module 100 may detect one or more faulty memory cells of the memory devices 120n classified as the normal memory channel C1. For example, the memory module 100 may continuously receive read requests, the number of which is given, from the host 200 with regard to any storage space. In this case, the read request that is received from the host 200 with regard to a storage space of the normal memory channel C1 may be transferred to the processing memory channel C2. As such, the processing circuit 115 may identically receive the read request provided from the host 200. The processing circuit 115 may detect whether a read request associated with the same address is repeatedly received from the host 200 as much as the given number of times or more. As a result, the processing circuit 115 may determine that faulty memory cells included in a memory cell array corresponding to a physical address of the corresponding storage space is one or more.

In operation S520a, the memory module 100 may read data from the storage space of the memory devices 120p corresponding to the storage space of the memory devices 120n in which the faulty memory cells are included. For example, the processing circuit 115 may access the storage space of the memory devices 120p classified as the processing memory channel C2 in response to read requests continuously received from the host 200. In other words, the processing circuit 115 may access mirror data corresponding to data stored in the storage space in which the faulty memory cells are included. The processing circuit 115 may provide the mirror data to the buffer 114.

In operation S530a, the memory module 100 may transmit the mirror data to the host 200 instead of the data stored in the storage space in which the faulty memory cells are included. For example, in the case where the host 200 transmits the address signal ADD indicating the storage space of the memory devices 120n in which the faulty memory cells are included, to the memory module 100, the router 112 may provide the mirror data stored in the buffer 114 to the host 200. As such, the performance of the memory module 100 may be improved.

Figure 9B:
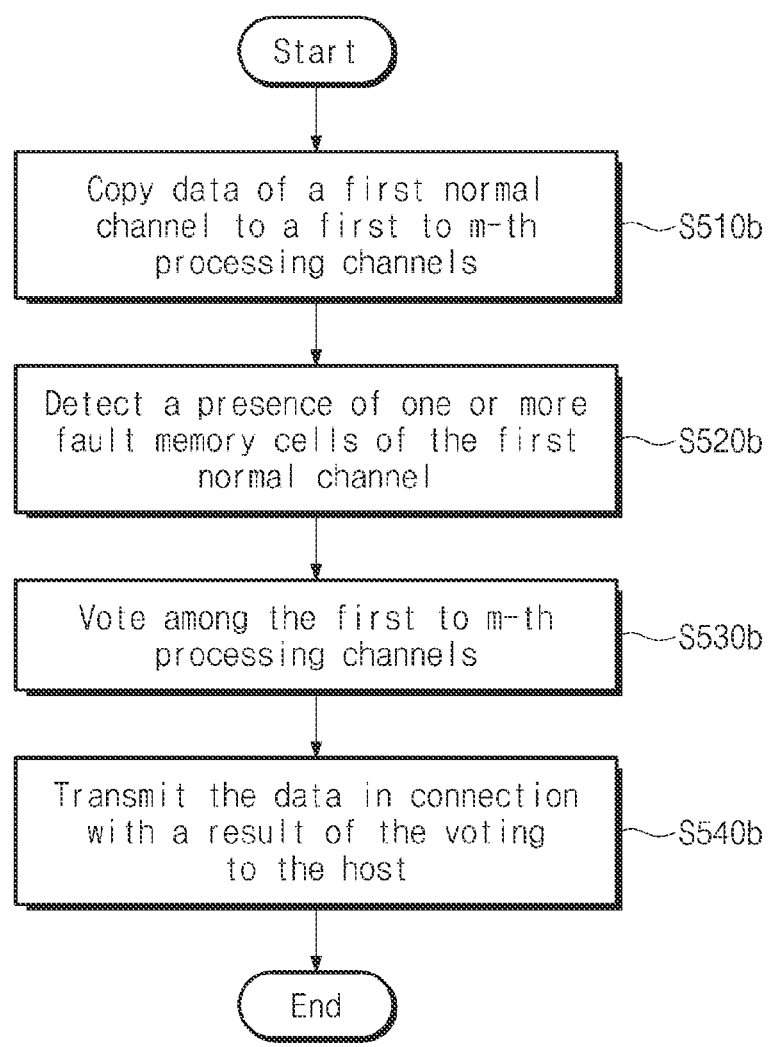
FIG. 9B is a flowchart illustrating a portion of an operating method of a memory module, when an operating mode of a router of FIG. 2 is determined as a mirror mode.

FIG. 9B is a flowchart illustrating a portion of an operating method of a memory module, when an operating mode of a router of FIG. 2 is set in a mirror mode of operation. In an embodiment, the memory module 100 may include a plurality of normal memory channels and a plurality of processing memory channels. Referring to FIGS. 1, 2, and 9B, the memory module 100 may perform operation S510b to operation S540b.

In operation S510b, the memory module 100 may copy data stored in memory devices classified as a first normal memory channel to memory devices classified as first to m-th processing memory channels (m being a positive integer) among the plurality of processing memory channels. For example, the router 112 may transfer an access request for memory devices classified as the first normal memory channel to the memory devices classified as the first to m-th processing memory channels. As such, data received from the host 200 may be stored in the memory devices classified as the first to m-th processing memory channels. As a result, compared to FIG. 9A, the number of copies of the data received from the host 200 may increase.

In operation S520b, the memory module 100 may detect the existence of faulty memory cells included in the memory devices classified as the first normal memory channel. In other words, the memory module 100 may detect a fault of the first normal memory channel. For example, as in the way described in operation S510a of FIG. 9, the memory module 100 may detect the existence of faulty memory cells.

In operation S530b, the memory module 100 may vote between the memory devices classified as the first to m-th processing memory channels. For example, the memory module 100 may receive a read request for a storage space, in which faulty memory cells are included, from the host 200. The processing circuit 115 may access the storage spaces of the first to m-th processing memory channels, which corresponds to the storage space in which the faulty memory cells are included, in response to the read request from the host 200. The processing circuit 115 may read first to m-th candidate data respectively stored in the first to m-th processing memory channels.

The processing circuit 115 may compare the first to m-th candidate data with each other and may determine mirror data corresponding to data stored in the storage space in which the faulty memory cells are included, depending on the majority rule. In an embodiment, when m is 3, the processing circuit 115 may compare first to third candidate data with each other. In this case, the first and second candidate data may be identical, and the first candidate data may be different from the third candidate data. The processing circuit 115 may determine or select the first candidate data as the mirror data based on a result of the comparison.

In operation S540b, the memory module 100 may transmit data associated with a result of the voting performed in operation S530b to the host 200. For example, the memory module 100 may store the mirror data determined in operation S530b in the buffer 114. The memory module 100 may transmit the mirror data stored in the buffer 114 in response to a read request provided from the host 200 with regard to the storage space of the memory device in which the faulty memory cells are includes.

Figure 10:
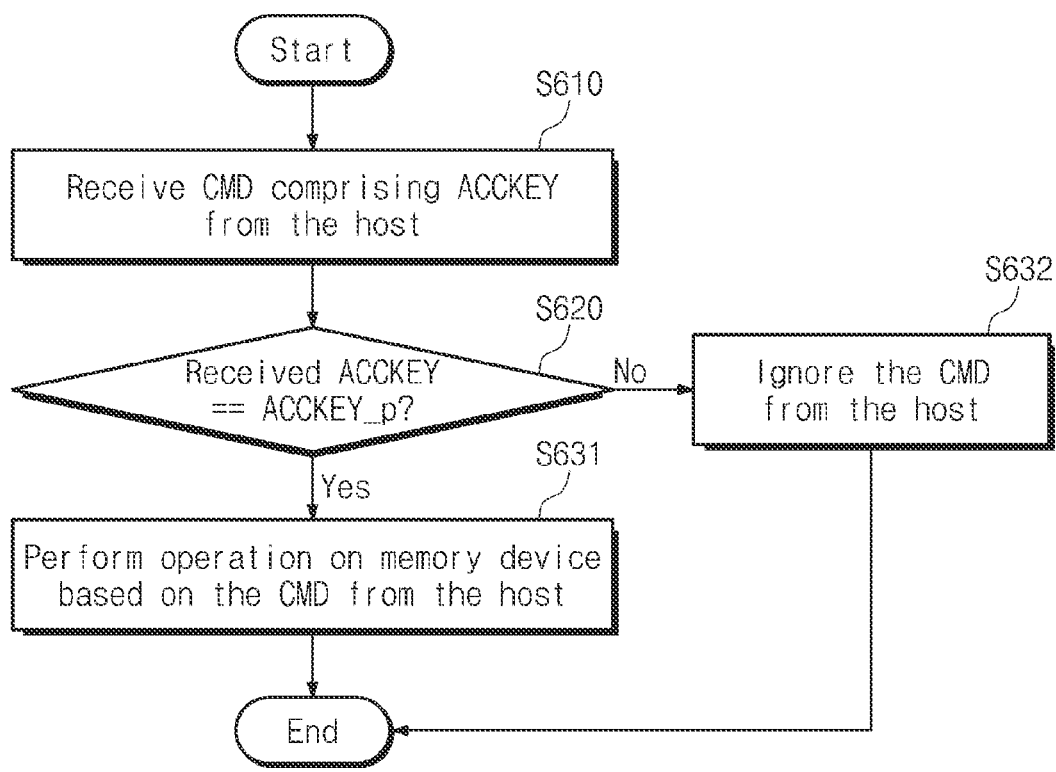
FIG. 10 is a flowchart illustrating an operating method of a memory module of FIG. 1.

FIG. 10 is a flowchart illustrating an operating method of a memory module of FIG. 1. Referring to FIGS. 1 to 3 and 10, the memory module 100 may further perform operation S610 to operation S630. In operation S610, the memory module 100 may receive the mode register set command MRS including an access code ACCKEY from the host 200. In an embodiment, the access code ACCKEY may be a code that is determined in advance when the host 200 or the memory module 100 is manufactured. The memory module 100 may store the received access code ACCKEY in the mode register 113.

In operation S620, the memory module 100 may compare the access code ACCKEY received from the host 200 with an access code ACCKEY_p stored in advance in the processing buffer circuit 110. For example, the processing circuit 115 may receive the access code ACCKEY from the router 112. The processing circuit 115 may compare the received access code ACCKEY with the access code ACCKEY_p stored in advance. When the received access code ACCKEY is identical to the access code ACCKEY_p stored in advance, the memory module 100 may perform operation S631. When the received access code ACCKEY is different from the access code ACCKEY_p stored in advance, the memory module 100 may perform operation S632.

In operation S631, the memory module 100 may perform an operation on the memory devices 120, based on the command signal CMD received from the host 200. For example, the router 112 may permit the host 200 to access a storage space of the memory devices 120 or the buffer 114, based on an operating mode of the router 112. As such, the host 200 may read data stored in the memory module 100 or may write data in the memory module 100. In step S632, the memory module 100 may ignore the command signal CMD received from the host 200. In other words, an access request for the memory devices 120 received from the host 200 may be ignored by the memory module 100. As such, the memory module 100 having improved security may be provided.

Figure 11:
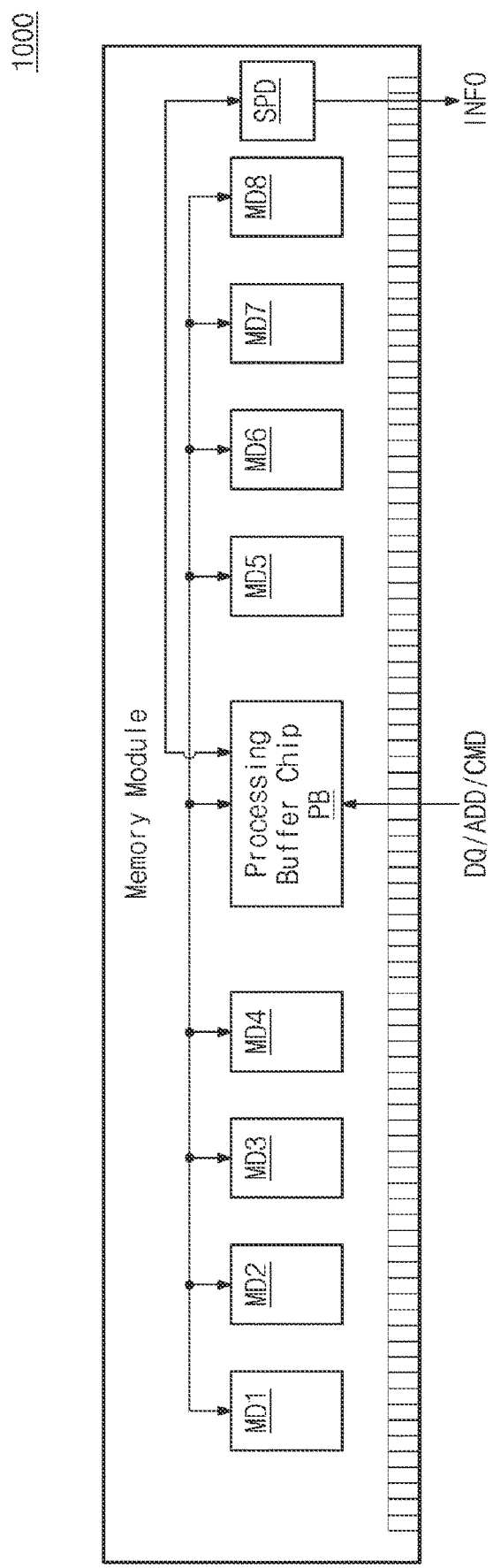
FIG. 11 illustrates a block diagram of a memory module according to an embodiment of the inventive concept.

FIG. 11 illustrates a block diagram of a memory module according to an embodiment of the inventive concept. Referring to FIGS. 1, 2, and 11, a memory module 1000 may include first to eighth memory chips MD1 to MD8, a processing buffer chip PB, and a serial presence detect (SPD) chip. The first to eighth memory chips MD1 to MD8 may be DRAM chips, respectively. The first to eighth memory chips MD1 to MD8 may store data. The first to eighth memory chips MD1 to MD8 may be connected to the processing buffer chip PB. An embodiment is illustrated as the memory module 1000 includes eight memory chips, but the number of memory chips that the memory module 1000 is capable of including is not limited thereto.

The processing buffer chip PB may receive the data signal DQ, the address signal ADD, and the command signal CMD from the host 200 through a memory interface complying with the DDR SDRAM standard. In an embodiment, the processing buffer chip PB may include the processing buffer circuit 110 of FIG. 2. The processing buffer chip PB may perform an operation on the first to eighth memory chips MD1 to MD8 based on the data signal DQ, the address signal ADD, and the command signal CMD thus received.

For example, the processing buffer chip PB may read data stored in the first to eighth memory chips MD1 to MD8 or may write data received from the host 200 in the first to eighth memory chips MD1 to MD8. The processing buffer chip PB may process a portion of data stored in the first to eighth memory chips MD1 to MD8.

The SPD chip SPD may store information associated with the memory module 1000. The SPD chip SPD may transmit a module information signal INFO including the information associated with the memory module 1000 to the host 200 through the memory interface complying with the DDR SDRAM standard. An operation of the SPD chip SPD will be more fully described later.

In an embodiment, the memory module 1000 may be implemented with a dual in-line memory module (DIMM) complying with the JEDEC standard. In this case, memory chips included in the memory module 1000 may be classified into a normal memory channel and/or a processing memory channel in various schemes.

For example, in the case where the memory module 1000 is implemented with the DIMM, memory chips disposed on one surface (e.g., a front surface) of the memory module 1000 may be classified as the normal memory channel, and memory chips disposed on another surface (e.g., a back surface) of the memory module 1000 may be classified as the processing memory channel.

For another example, in the case where the memory module 1000 is implemented with the DIMM, the memory chips may form ranks. Memory chips included in some ranks of a plurality of ranks included in the memory module 1000 may be classified as the normal memory channel, and memory chips included in the remaining ranks may be classified as the processing memory channel. For example, in the case where memory chips form first to fourth ranks, memory chips belonging to the first and second ranks may be classified as the normal memory channel, and memory chips belonging to the third and fourth ranks may be classified as the processing memory channel. However, a way to classify memory chips is not limited to the above example.

Figure 12:
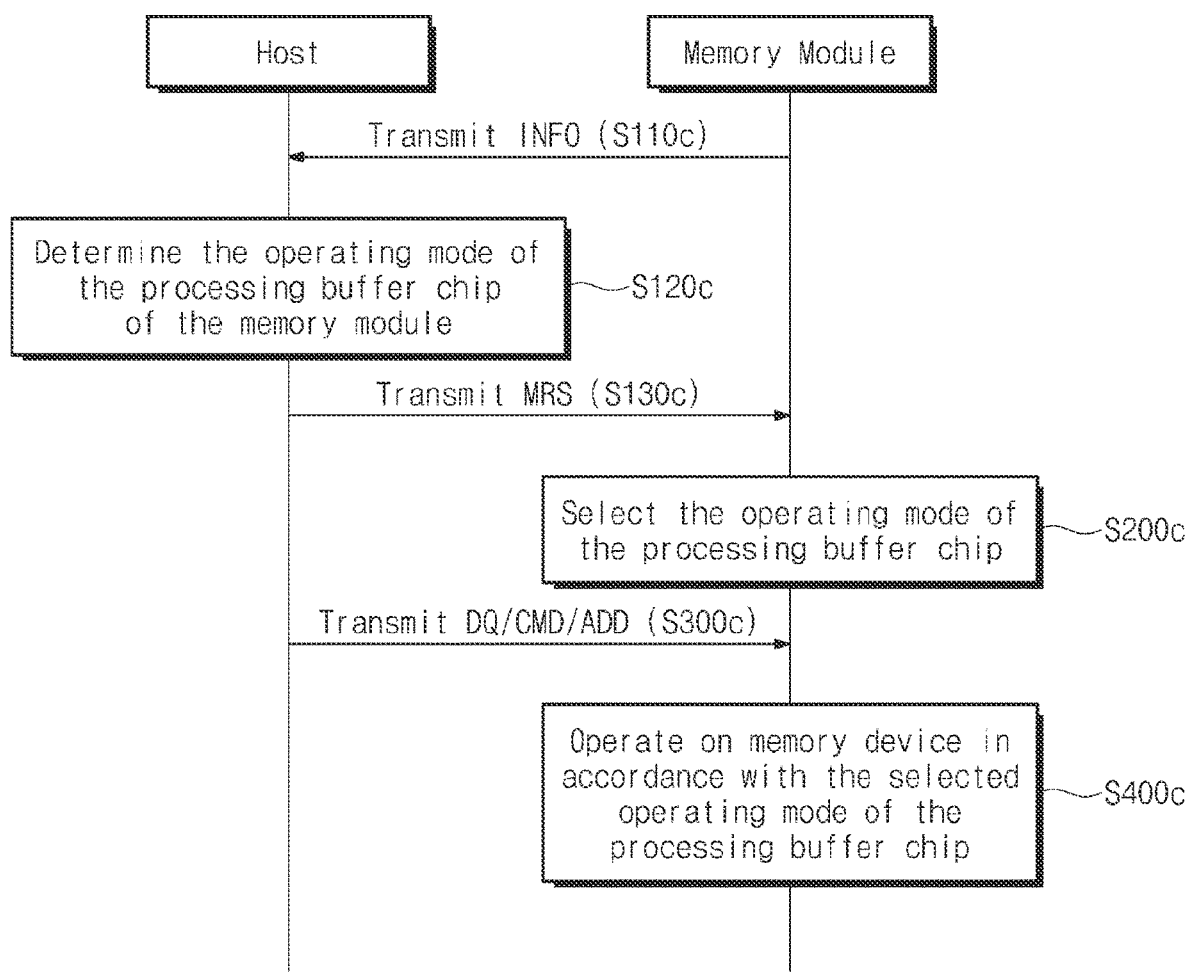
FIG. 12 is a flowchart illustrating an operating method of a memory system including a memory module of FIG. 11.

FIG. 12 is a flowchart illustrating an operating method of a memory system including a memory module of FIG. 11. Referring to FIGS. 1, 2, 11, and 12, the memory system 10 including the memory module 1000 of FIG. 11 may perform operation S110c to operation S130c, operation S200c, operation S300c, and operation 400c. In operation S110c, the memory module 1000 of the memory system 10 may transmit the module information signal INFO to the host 200. In some embodiments, this module information signal INFO may include a variety of information about the memory module 1000, such as information indicating that the memory module 1000 includes the processing buffer chip PB, a kind of an operating mode of the processing buffer chip PB, and a kind of an operation capable of being performed by the processing buffer chip PB. The SPD chip SPD may transmit the module information signal INFO to the host 200 through the memory interface complying with the DDR SDRAM standard.

In operation S120c, the host 200 of the memory system 10 may determine an operating mode of the processing buffer chip PB in the memory module 1000. For example, the host 200 may check that the memory module 1000 is capable of receiving a command for an offload through the DDR SDRAM standard interface, based on the received module information signal INFO. The host 200 may determine how components included in the processing buffer chip PB of the memory module 1000 operate. For example, the host 200 may determine an operating mode of the router 112 or the processing circuit 115 of the processing buffer circuit 110 included in the processing buffer chip PB.

In operation S130c, the host 200 of the memory system 10 may transmit the command signal CMD to the memory module 1000. For example, the host 200 may issue the command signal CMD comprising mode register set command MRS associated with an operation of the processing buffer chip PB, based on a result of operation S120c. The host 200 may transmit the command signal CMD to the memory module 1000 through a memory interface complying with the DDR standard.

In operation S200c, the memory module 1000 of the memory system 10 may select an operating mode of the processing buffer chip PB. For example, the memory module 1000 may determine an operating mode of the router 112 and the processing circuit 115 and a storage space capable of being accessed by the host 200, based on the command signal CMD received in operation S130c.

In operation S300c, the host 200 of the memory system 10 may transmit the data signal DQ, the command signal CMD and the address signal ADD to the memory module 1000. In operation S400c, the memory module 1000 of the memory system 10 may operate on memory devices depending on the selected operating mode of the processing buffer chip PB. For example, the processing buffer chip PB may operate based on the operating mode of the router 112 and the processing circuit 115 determined in operation S200c and the storage space capable of being accessed by the host 200. The processing buffer chip PB may access at least a part of the first to eighth memory chips MD1 to MD8 based on the data signal DQ, the command signal CMD, and the address signal ADD.

According to an embodiment of the inventive concept, there may be provided a PIM or FIM capable of accessing data at a memory module level without additional intervention of a host or a CPU. For example, a PIM or FIM having a separate bandwidth for processing data may be provided within a memory module. As such, the performance of data processing of the memory module may be improved.

As a memory module according to an embodiment of the inventive concept is used, the performance of an application using a machine learning or deep learning algorithm may be improved. For example, in the case of processing data based on an algorithm such as a recurrent neural network (RNN), multilayer perceptron (MLP), or a CNN having a fully-connected layer structure, because the amount of data to be processed is large, a memory device may be frequently accessed. The memory module according to an embodiment of the inventive concept may provide a separate internal bandwidth for data processing, and thus, the throughput of the above applications may be improved.

According to an embodiment of the inventive concept, a deep learning accelerator based on a DDR memory channel may be provided. According to another embodiment of the inventive concept, a memory module including a pre-processor for acceleration of a CNN operation may be provided. For example, the memory module may transpose data of a matrix form received from a host, by using an internal processor. As the memory module stores the transposed data, the speed of the CNN operation may be improved.

According to another embodiment of the inventive concept, there may be provided a memory module that improves the reliability of data stored therein by mirroring data within the memory module. According to another embodiment of the inventive concept, there may be provided a memory module that is capable of providing a dual security function for data by verifying an access code received from a host by using an internal processor.

According to an embodiment of the inventive concept, data processing may be offloaded from a host to a memory module through a memory interface complying with the DDR standard. A memory module according to another embodiment of the inventive concept may include a processor capable of accessing storage spaces of different memory devices in the memory module without intervention of a host. As such, the performance of data processing and the compatibility of the memory module may be improved.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory module, comprising:
   a processing buffer circuit electrically coupled to first and second memory devices and a host, said processing buffer circuit configured to communicate with the host in compliance with a double data rate (DDR) synchronous dynamic random access memory (SDRAM) standard, and comprising:
      a processing circuit configured to process at least one of data received from the host, data stored in the first memory device, and data stored in the second memory device, in response to a processing command received from the host;
      a mode register configured to store information about an operation of the processing buffer circuit in response to a mode register set command including a command permitting an operation of all or a part of the processing circuit; and
      a buffer configured to store data processed by the processing circuit.

2. The memory module of claim 1, wherein the processing buffer circuit further comprises a router, which is configured to support access by the host to the first and second memory devices.

3. The memory module of claim 2,
   wherein, during an extension mode of operation, the router provides the host with a storage space of the first memory device, all or a part of a storage space of the second memory device, and a storage space of the buffer as an access target, and provides the processing circuit with all or a part of the storage space of the second memory device as an access target; and
   wherein, during a mirror mode of operation, the router provides the processing circuit with an access request for the first memory device received from the host.

4. The memory module of claim 3, wherein, during the extension mode of operation, the processing circuit: (i) processes at least one of the data received from the host, the data stored in the first memory device, and/or the data stored in the second memory device based on the processing command, and (ii) stores the processed data in the buffer.

5. The memory module of claim 4, wherein the storage space of the first memory device is accessed by the host while the processing circuit processes data.

6. The memory module of claim 1, wherein the processing circuit is configured to scrub the second memory device periodically and/or in response to a scrub request received from the host.

7. The memory module of claim 1, further comprising a third memory device and a fourth memory device; and
   wherein, in response to the information stored in response to the mode register set command, the mode register classifies at least one memory device of the first through fourth memory devices as a normal memory channel, and classifies remaining memory devices of the first through fourth memory devices as a processing memory channel; and
   wherein, during the extension mode of operation, the processing circuit processes data stored in each of the first through fourth memory devices based on the processing command, and stores the processed data in the buffer; and
   wherein, during the mirror mode of operation, the processing circuit copies at least a portion of data stored in the memory device of the normal memory channel to a corresponding one of the memory devices of the processing memory channel.

8. An operating method of a memory module which includes a normal memory channel and a processing memory channel, each of the normal memory channel and the processing memory channel sharing a router of a processing buffer circuit and including a memory cell array, the method comprising:
   setting an operating mode of the router to one of an extension mode or a mirror mode, based on a mode register set command received from a host;
   accessing data stored in the normal memory channel and the processing memory channel, based on an address and a command received from the host and the set operating mode of the router; and
   processing, at a processing circuit included in the processing buffer circuit, the accessed data based on a processing command received from the host;
   wherein the mode register set command, the address, the command, and the processing command are transmitted from the host to the memory module in compliance with a double data rate (DDR) synchronous dynamic random access memory (SDRAM) standard.

9. The method of claim 8, wherein, when the operating mode of the router is determined as the extension mode, the determining of the operating mode of the router includes permitting an operation of a logic circuit performing data processing of the processing circuit in response to a permission request of the host; and wherein the logic circuit performs an operation on the accessed data based on the processing command.

10. The method of claim 8, wherein, when the operating mode of the router is determined as the mirror mode, the determining of the operating mode of the router includes permitting an operation of a logic circuit of the processing circuit; and wherein the accessing the data stored in the normal memory channel and the processing memory channel includes delivering an access to a storage space of the normal memory channel to the processing circuit.

11. The method of claim 10, wherein the processing of the accessed data further includes:
performing, at the processing circuit, an operation on the accessed data based on the processing command;
storing a result of the operation in a buffer of the processing buffer circuit; and
providing the result of the operation stored in the buffer to the host in response to a read request from the host.

12. The method of claim 10, wherein the processing of the accessed data further includes:
detecting a fault of a memory cell included in the normal memory channel;
reading a mirror data stored in the processing channel, the mirror data corresponding to a data stored in the memory cell in which the fault is detected, in response to a read request from the host with regard to data stored in the normal memory channel; and
providing the mirror data to the host.

13. The method of claim 12,
wherein the processing memory channel includes a first mirror channel, a second mirror channel, and a third mirror channel to which the data stored in the normal memory channel are copied;
wherein the reading of the mirror data includes:
respectively reading first candidate data, second candidate data, and third candidate data corresponding to the data stored in the memory cell in which the fault is detected, from the first mirror channel, the second mirror channel, and the third mirror channel in response to the read request; and
determining one of the first to third candidate data as the mirror data based on a majority voting.

14. The method of claim 10, wherein the accessing of the data includes comparing an access code included in the mode register set command with a code stored in advance in the processing buffer circuit; wherein when the access code is different from the code stored in advance, ignoring the command received from the host; and wherein when the access code is identical to the code stored in advance, accessing the data stored in the normal memory channel based on the command.

15. A memory module comprising:
a processing buffer chip; and
one or more DRAM chips which store data;
wherein the one or more DRAM chips form a normal memory channel and a processing memory channel;
wherein the processing buffer chip includes:
a physical layer, which receives a command/address signal and a data signal from a host;
a first memory controller and a second memory controller, which respectively access the normal memory channel and the processing memory channel based on the command/address signal;
a processing circuit, which processes at least a portion of data stored in the normal memory channel accessed through the first memory controller and data stored in the processing memory channel accessed through the second memory controller, based on a processing command included in the data signal;
a buffer, which stores data processed by the processing circuit; and
a router, which receives the command/address signal and the data signal from the physical layer, and transmits the command/address signal and the data signal to the first memory controller and the buffer; and
wherein the processing buffer circuit communicates with the host in compliance with a double data rate (DDR) synchronous dynamic random access memory (SDRAM) standard.

16. The memory module of claim 15, wherein the memory module is a dual in-line memory module (DIMM).

17. The memory module of claim 15, further comprising:
a serial presence detect (SPD) chip which transmits a module information signal including information about the memory module to the host; and
wherein the processing buffer chip receives a mode register set command generated based on the module information signal from the host, and permits an operation of a logic circuit of the processing circuit based on the mode register set command.

18. The memory module of claim 15, further comprising:
a mode register which receives a mode register set command received from the host through the physical layer and stores information about an operation of the processing buffer chip in response to the received mode register set command; and
wherein an operation of a logic circuit of the processing circuit is permitted in response to the information stored in response to the received mode register set command.

19. The memory module of claim 15, wherein the router provides the buffer with data which are accessed through the first memory controller and are stored in the normal memory channel; and wherein the processing circuit performs an operation on the data, which are stored in the normal memory channel and are provided to the buffer, based on the processing command.

* * * * *